(12) United States Patent
Nathanson et al.

(10) Patent No.: US 6,486,511 B1
(45) Date of Patent: Nov. 26, 2002

(54) SOLID STATE RF SWITCH WITH HIGH CUTOFF FREQUENCY

(75) Inventors: Harvey C. Nathanson, Pittsburgh, PA (US); Philip C. Smith, Ellicott City, MD (US); R. Chris Clarke, Sykesville, MD (US); David M. Krafcsik, Crownsville, MD (US); Lawrence E. Dickens, Baltimore, MD (US)

(73) Assignee: Northrop Grumman Corporation, Baltimore, MD (US)

( * ) Notice: Subject to any disclaimer, the term of this patent is extended or adjusted under 35 U.S.C. 154(b) by 0 days.

(21) Appl. No.: 09/942,824

(22) Filed: Aug. 30, 2001

(51) Int. Cl.[7] .................. H01L 29/74; H01L 31/111; H01L 29/76; H01L 29/94; H01L 31/062; H01L 31/113; H01L 31/119

(52) U.S. Cl. .................. 257/328; 257/331; 257/401; 257/403; 257/136

(58) Field of Search .................. 257/328, 329, 257/330, 331, 332, 401, 403, 135, 136

(56) References Cited

U.S. PATENT DOCUMENTS 5,969,385 A * 10/1999 Nathanson .................. 257/347
6,262,453 B1 * 7/2001 Hshieh .................. 257/304
6,285,060 B1 * 9/2001 Korec et al. .................. 257/331

OTHER PUBLICATIONS

Streetman, Solid State Electronic Devices, 1995, Prentice Hall, Inc., fourth edition, p. 354.*

* cited by examiner

Primary Examiner—Nathan J. Flynn
Assistant Examiner—Victor A. Mandala, Jr.

(57) ABSTRACT

A solid state microwave switch having a plurality of adjacent parallel fingers covered with an oxide layer. One end of a finger is an N+ source region while the other end is an N+ drain region, with a current conducting N region between them. The oxide layer is covered with a gate layer to which a gate signal is applied for control of current between the N+ regions through the N region. The gate layer is highly resistive and has a sheet resistance on the order of millions of ohms per square. The length from the source to drain region is around 2 $\mu$m, and the fingers are spaced with a pitch of around 1 $\mu$m.

15 Claims, 13 Drawing Sheets

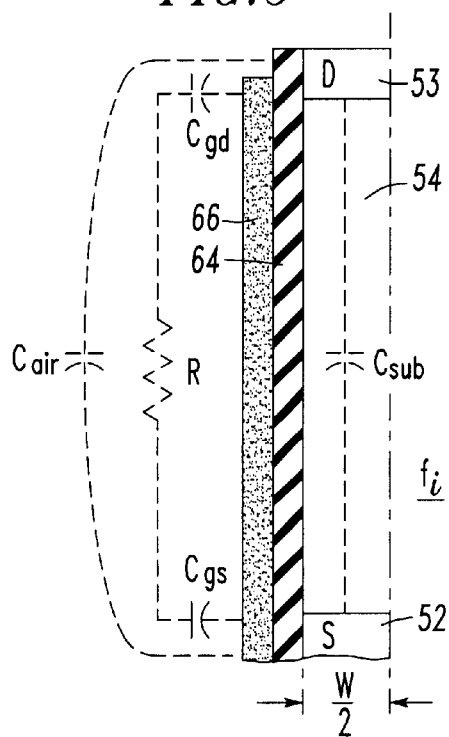
FIG.5
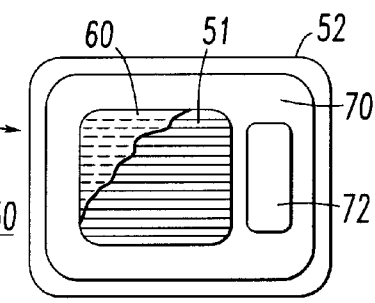
FIG.6
FIG.6A
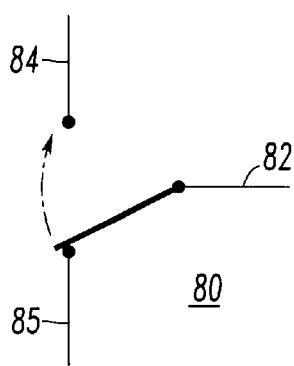
FIG.7
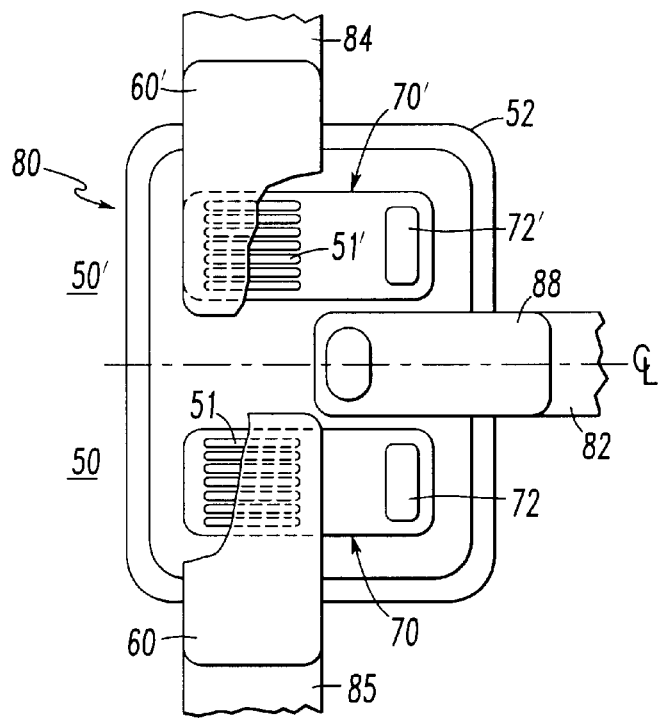
FIG.7A

SOLID STATE RF SWITCH WITH HIGH CUTOFF FREQUENCY

BACKGROUND OF THE INVENTION

1. Field of the Invention

The invention in general relates to miniature switches and more particularly to a switch useful in radar and other high frequency applications.

2. Description of Related Art

A variety of MEMS (microelectromechanical systems) switches are in use, or proposed for use, in radar, as well as other high frequency circuits for controlling RF signals. These MEMS switches are popular insofar as they have a relatively high off impedance and a relatively low on impedance, with a low off capacitance, leading to desirable high cutoff frequencies. Additionally, the MEMS switches have a small footprint and can operate at high RF voltages.

These MEMS switches generally have electrostatic elements which are attracted to one another upon application of a control signal. This may possibly lead to short and long term variability in the switching voltage due to, for example, uncontrolled electrostatic charging effects. In addition, the manufacturing yield and potential need for hermetic sealing of the MEMS switches are of concern.

Traditionally, many RF circuits utilize solid state switch elements for RF signal control. For example, electronic RF switches in common use include the GaAs (gallium arsenide) based PMEMT (pseudomorphic high electron mobility transistor) and the GaAs pin diode. Both of these devices can operate at high cutoff frequencies and can achieve switching rates measurable in tens of nanoseconds.

For some applications however, the GaAs PHEMT has an objectionably high resistance when closed and a relatively low cut-off frequency, for example, 600 GHz (Gigahertz). The pin diode exhibits a higher cut-off frequency of around 2 THz (Terahertz), however it, along with the GaAs PHEMT, can exhibit an objectionably high capacitance in the off state. For this reason these RF switches are often operated with a separate shunt inductor resonant with the capacitance, at the operating frequency.

This added inductor advantageously increases the impedance of the switch in the off condition, however this arrangement objectionably lowers the operating bandwidth of the overall switch device.

In an ideal switch, during operation the switch impedance would be infinite when open ($Z_{off}$), to prevent signal flow, and zero ($Z_{on}$) when closed to allow signal flow without adding any undesired impedance. That is, the ideal $Z_{off}/Z_{on}$ would be equal to infinity. This however is not possible and a practical acceptable value would be on the order of 100 or 200. Most variable capacitive MEMS type and solid state switches do not achieve this high isolation ratio.

This $Z_{off}/Z_{on}$ ratio is also related to the ratio of the cutoff frequency $F_{cc}$ to the operating frequency $F_o$. That is:

$$Z_{off}/Z_{on}=F_{cc}/F_o \qquad \text{Eq. (1)}$$

Basically, the higher the cutoff frequency $F_{cc}$ the higher the operating frequency $F_c$ can be while still maintaining a desired off/on impedance ratio of 100 or higher. For example, with a $F_{cc}=1$ THz, the operating frequency can be as high as 10 GHz. Devices with higher cutoff frequencies would accommodate even higher operating frequencies, particularly suited for radar and other high frequency circuits.

It is a primary object of the present invention to provide a solid state switch having a cutoff frequency in the THz range, and which is highly reliable, is reproducible, economical and has a small footprint. Additionally, the switch of the present invention can achieve a $Z_{off}/Z_{on}$ ratio of 100 or greater at 10 GHz or more. Further, the switch allows realization of cutoff frequencies as high as 5 THz as a result of its unique fabricatable geometry.

SUMMARY OF THE INVENTION

An RF switch in accordance with the present invention includes a plurality of parallel semiconductor fingers each having first and second ends, with one of the ends constituting a source region and the other end constituting a drain region. Each finger has a width no more than around 5000 Å. An oxide layer is formed on the outside of the finger and a high resistance gate layer is deposited on the oxide layer. This gate layer has a sheet resistance ranging from around 100,000 to millions of ohms per square. Respective electrical contacts are in electrical communication with the gate layer and source and drain regions.

BRIEF DESCRIPTION OF THE DRAWINGS

FIG. 5 illustrates one half of a typical finger as illustrated in FIG. 3.

FIG. 6 is a representation of a single pole single throw switch.

FIG. 6A is a plan view of the switch of FIG. 4, to accomplish the function of the single pole single throw switch of FIG. 6.

FIG. 7 is a representation of a single pole double throw switch.

FIG. 7A is a plan view of a switch, as in FIG. 4, suitably modified to accomplish the function of the single pole double throw switch of FIG. 7.

DESCRIPTION OF THE PREFERRED EMBODIMENT

Figure 1:
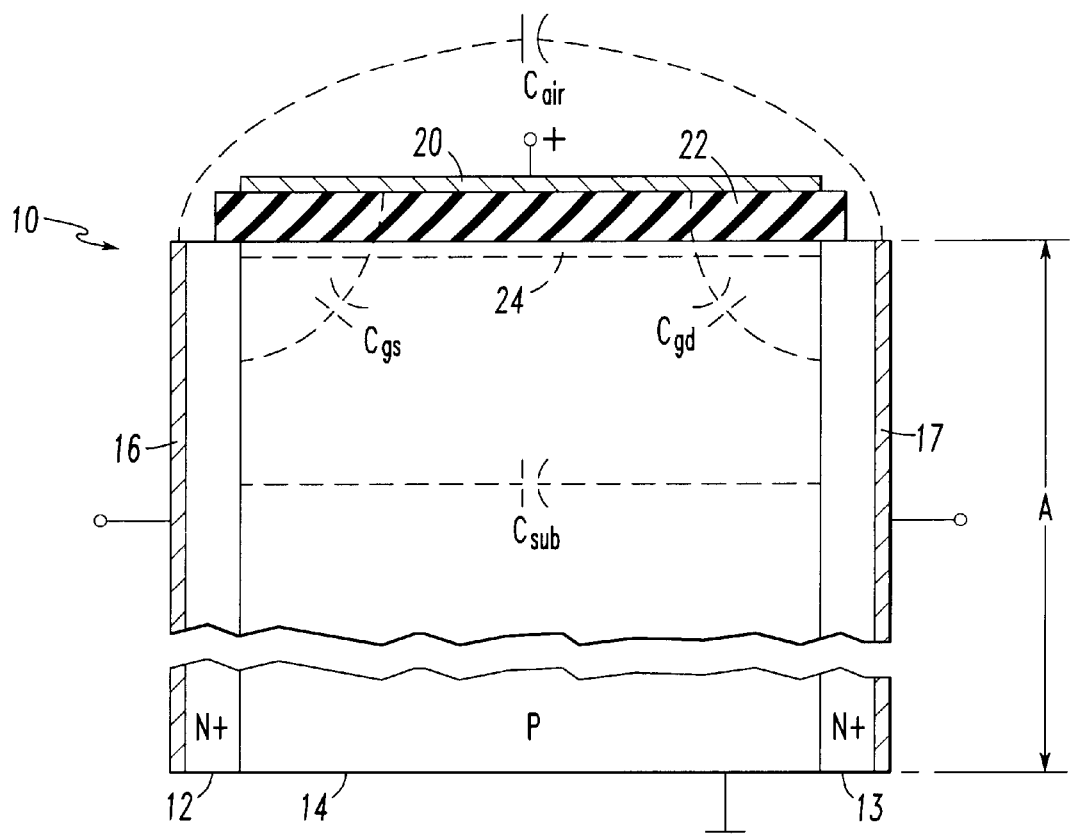
FIG. 1 illustrates one type of MOSFET of the prior art.

In the drawings, which are not necessarily to scale, like or corresponding parts are denoted by like or corresponding reference numerals. In addition, terms such as top, bottom, front, back, side, vertical, horizontal etc. are used herein for ease of explanation and not as structural or orientation limitations.

As background to an understanding of the present invention, reference is made to FIG. 1 which illustrates, in cross-section, one type of typical MOSFET (metal-oxide-semiconductor field effect transistor). MOSFET 10 includes source and drain regions 12 and 13 of N+ type conductivity, which straddle an intermediate body, or substrate 14, of P type conductivity, having a width A on the order of several to tens of µm (microns).

Electrical connection is made to the source and drain regions 12 and 13 by means of respective metal contacts 16 and 17, and a metal gate 20 is positioned above, and insulated from, the substrate 14 by an oxide layer 22. For added stability, the substrate 14 is grounded. The device 10 may be operated in the enhancement, or accumulation mode by application of a positive voltage at the gate 20. That is, when a positive voltage above a certain threshold is applied, majority carriers (electrons) are attracted into an induced narrow channel 24 adjacent the oxide layer 22, thus permitting current flow from source to drain.

The current carrying channel 24 is extremely narrow, for example, on the order of 50 Å to 100 Å (Angstroms), compared to the thickness of the substrate 14 and thus the device 10 has a very high current density in channel 24. For example, a high performance MOSFET can carry a peak current of 5 amps/cm. If the channel width is about 50 Å, the current density in the channel is around 10,000,000 amps/cm$^2$.

This high current density would be ideal for an RF switch, however the device of FIG. 1 is not suitable for this use especially when the RF signals to be controlled are in the high GHz and THz range. More particularly, the cutoff frequency $F_{cc}$ is given by the relationship:

$$F_{cc} = 1/(2\pi * R_{on} * C_{off}) \quad \text{Eq.(2)}$$

In the device of FIG. 1, when in the off condition, there exists a large capacitance effect $C_{sub}$ through the substrate 14, between the source region 12 and drain region 13, contributing to the off capacitance denoted as $C_{off}$ in Eq. (2). In addition, fringe capacitance $C_{gd}$ between the gate and source, and $C_{gd}$ between the gate and drain also contribute to the total $C_{off}$, as does the capacitance $C_{air}$ between source and drain through the air. The higher the value of $C_{off}$ in the denominator of Eq. (2), the lower will be the resultant value of $F_{cc}$.

Further, for isolation purposes, it is desired to have as high a $Z_{off}/Z_{on}$ ratio as possible, values of 100 or higher being exemplary. However, the off impedance $Z_{off}$ is also inversely proportional to the off capacitance as in Eq. (3), $$Z_{off} = 1/(2\pi F_c * C_{off}) \quad \text{Eq. (3)}$$

resulting in an undesirably low value for $Z_{off}$ due to the high $C_{off}$.

Figure 2:
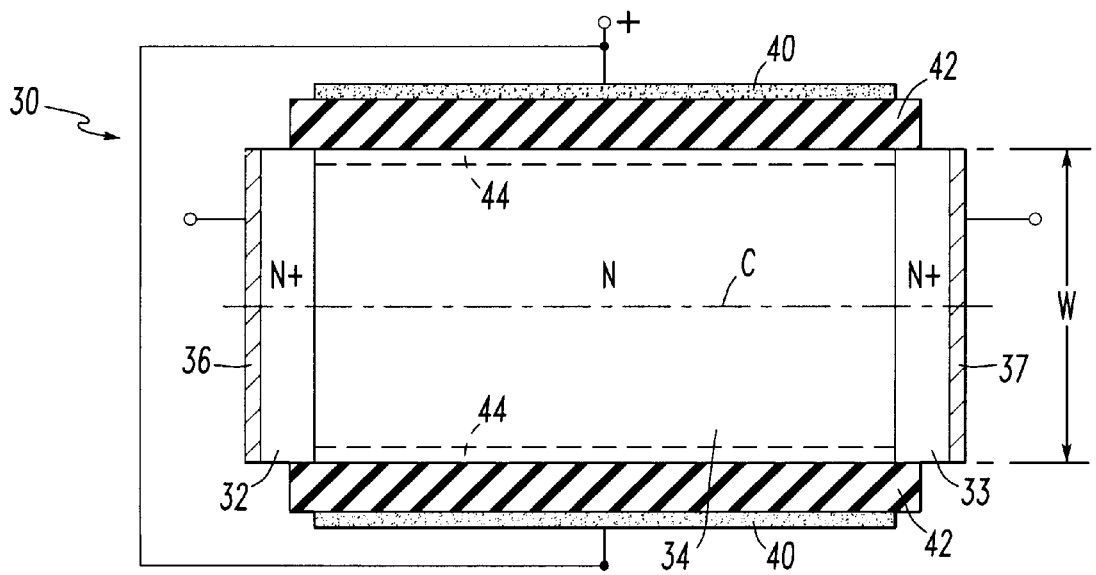
FIG. 2 is a semiconductor construction to aid in an understanding of the present invention.

The present invention obviates these drawbacks of using a MOSFET as a high frequency switch. Reference is made to FIG. 2 which illustrates a basic concept utilized in the structural arrangement of one embodiment of the invention.

The device 30 of FIG. 2 has a width W and is symmetrical about a centerline C. The device includes source and drain regions 32 and 33 of N+ conductivity, which straddle an intermediate current conducting body 34. In order to obviate the need for a ground connection to the body 34 and ensure that there is no floating body effect, it is preferred that the body 34 be of the same N type conductivity as the source and drain regions 32 and 33, however with a smaller doping concentration. A MOSFET with this type of N+/N/N+ construction is shown in U.S. Pat. No. 5,969,385 for a low power logic device, and assigned to the same assignee as the present invention.

Electrical connection is made to the source and drain regions 32 and 33 by means of respective metal contacts 36 and 37, and gates 40 are positioned over, and insulated from, body 34 by respective oxide layers 42. The device 30 is operated in the accumulation mode by application of a positive voltage to the gates 40, to induce narrow current carrying channels 44 adjacent the respective oxide layers 42.

The device 30 of FIG. 2 is based upon the MOSFET design, however, with several significant differences. For example, the width W of device 30 is much smaller than the width A of MOSFET 10. Whereas the width A is in the several µm to tens of µm range, or greater, the width W has an upper limit of around 5000 Å, (1 µm is equivalent to 10,000 Å) and can be as narrow as practical, even approaching twice the width of channel 44, about 100 Å or less, if manufacturing techniques allow.

Another major difference between the device 30 and the MOSFET of FIG. 1 is the composition of the gate. In the typical MOSFET the gate is of a metal having a low sheet resistance, resulting in a low resistance gate. As is well known by those skilled in the art, sheet resistance is the electrical resistance of a thin sheet of material with uniform thickness as measured across opposite sides of a unit square pattern of deposited material, expressed in ohms per square. For a typical metal gate 20, the sheet resistance may be on the order of 0.1 ohms per square. In contrast, the gates 40 have a sheet resistance which may range from about 100,000 ohms per square to millions of ohms per square, for example on the order of 5×10$^6$ ohms per square, which would be fifty million times greater than the typical metal gate sheet resistance.

For a silicon device, the gates 44 may be of a thin film of polysilicon having the desired high sheet resistance. Some commercial MOSFETs are also fabricated with gates of polysilicon, however, to achieve a relatively low resistance, these polysilicon gates have a sheet resistance on the order of 1000 ohms per square, as compared with 100,000 to five million ohms per square, or greater, for the gates 40.

Figure 3:
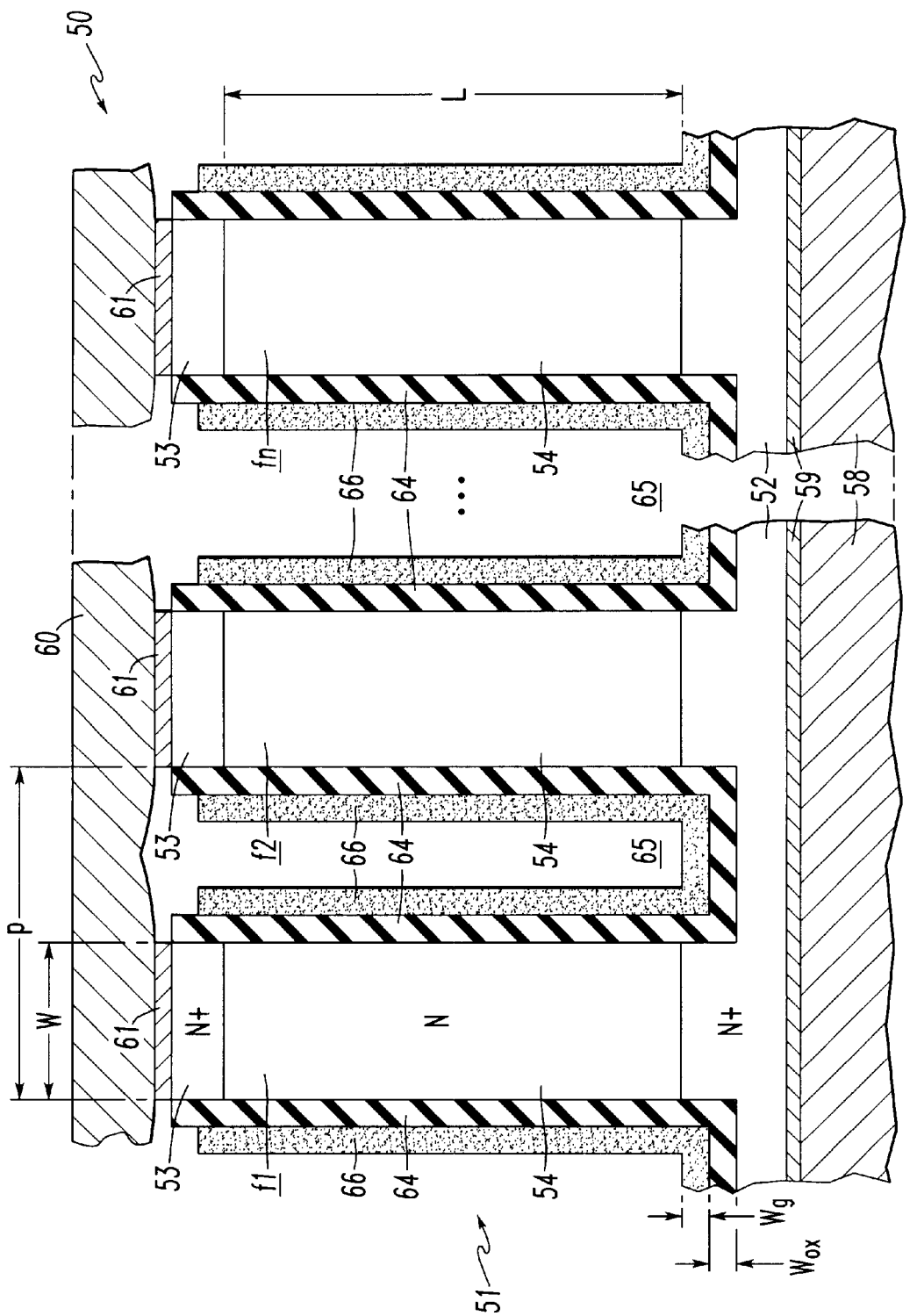
FIG. 3 illustrates one embodiment of the present invention.

The high frequency RF switch of the present invention is constituted by a plurality of the finger-like structure of FIG. 2, arranged in a vertical orientation, such as illustrated in FIG. 3. Switch 50 includes a plurality of parallel fingers 51, which may be of silicon, designated f1 ... fn, each having a common highly doped N+ source region 52 at one end, a highly doped N+ drain region 53 at second, or opposite end, and an intermediate body 54 of a lower doped N type conductivity. Although, by way of example, the source region 52 is shown as a common region for all of the fingers, and the drain region is located at the distal end of the finger, the regions could be reversed.

Electrical connection is made to the source region 52 by means of a source contact 58, through a contact interface 59, and electrical connection is made to the drain regions 53 by means of a drain contact 60 through a contact interface 61 on the distal ends of the extended fingers.

An oxide layer 64 is deposited or otherwise applied on the side walls (and ends) of the fingers and in the interfinger valleys 65 between the fingers in a manner that the oxide layer overlaps the source and drain regions 52 and 53. This application is followed by the application of a gate layer 66 which covers the vertical portion of oxide layer 64 and is of a material such as polysilicon having a high sheet resistance, on the order of 5×10$^6$ ohms per square, or greater, as previously discussed. As will be seen, the vertical portions of the gate layer 66 connect with a horizontal gate pad of a lower sheet resistance than the gate layer 66, for example, 5000 ohms per square, or 1,000 times lower than the gate layer 66.

Figure 4:
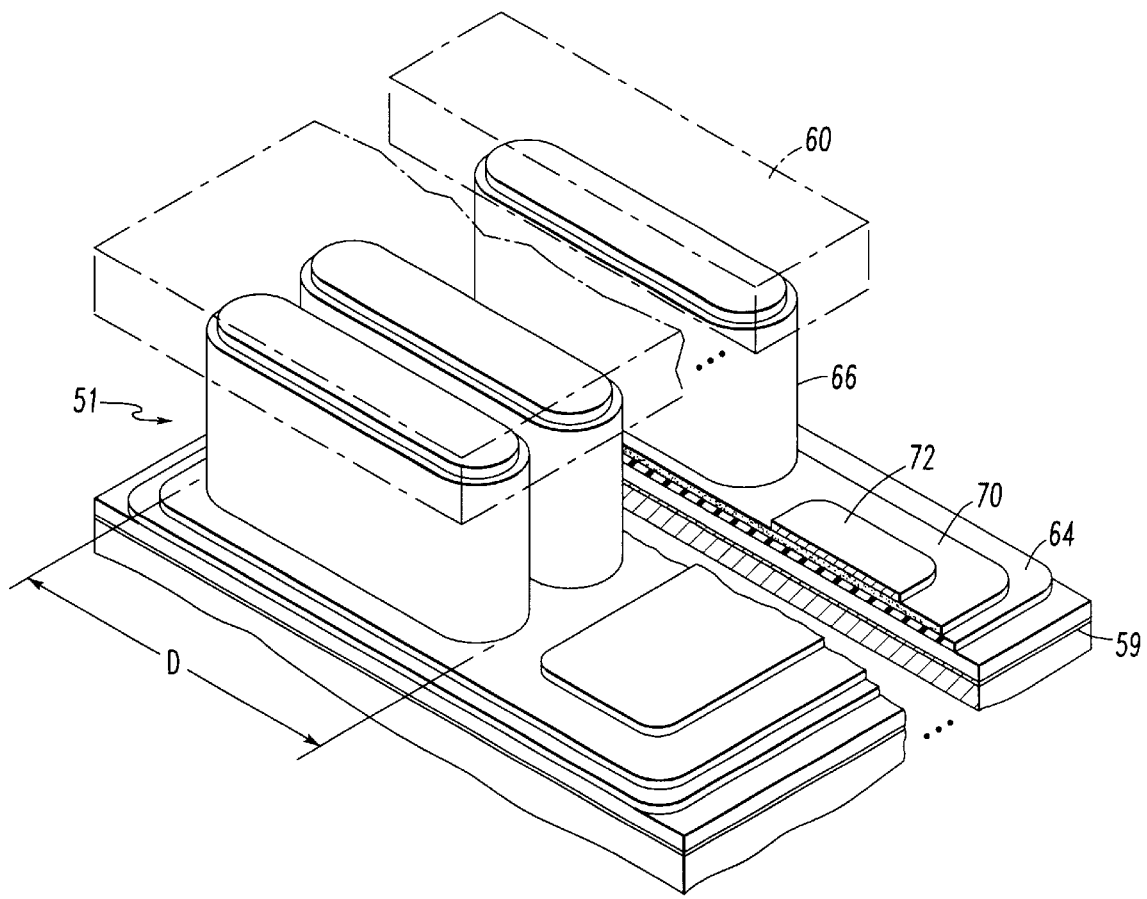
FIG. 4 is another view of the device of FIG. 3.

In a typical embodiment the switch 50 may be comprised of 71 fingers (n=71) on a pitch p of 1 µm, with the length L between source and drain regions 52 and 53 being 2 μm. The width W of a finger is, by way of example, 5000 Å (0.5 μm) or less, with smaller widths resulting in higher cutoff frequencies. The oxide layer 64 has a thickness $W_{ox}$ of, for example, 100–1000 Å and gate layer 66 has a thickness $W_g$ also of 100–1000 Å. With additional reference to FIG. 4, it is seen that each finger has a depth D, where D may be 71 μm, allowing for a generally square structure with a periphery of around 1 cm. (centimeter). The term "periphery", denoted by P, is used to designate the totality of depth of all fingers (71 fingers×two sides per finger×71 μm depth=1.00 cm). FIG. 4 illustrates that the fingers 51 are also parallel in the D direction.

FIG. 4 also illustrates the high resistance gate 66 of each finger connected to the lower resistance gate pad 70. A relatively low resistance gate pad contact 72, for example a metal such as gold, is deposited on the gate pad 70 material to serve as a contact for an input gate control voltage.

FIG. 5 depicts half of a typical finger, $f_i$ to illustrate certain values. When the switch is in an off condition, $C_{sub}$ contributes to the off capacitance and has a value which is a function of the width W/2 of the half finger. Even with a relatively large value of finger width, 5000 Å in the example, the $C_{sub}$ per unit depth is many tens of times lower than in a typical MOSFET. With smaller finger widths, the difference could be in the hundreds.

The finger $f_i$ has a slight overlap of the gate 66 with the source 52 and drain 53, leading to respective fringe capacitances $C_{ga}$ and $C_{gd}$. In a conventional MOSFET the low resistance gate causes the off capacitance to be elevated by the two overlap capacitances $C_{ga}$ and $C_{gd}$ in series, by virtually acting as a short between the source and drain, including the overlap capacitances. As previously discussed, for high frequency operation it is desired that the off capacitance be as low as possible. With the present invention the high sheet resistance gate, of high resistance R, does not act as a short, but rather as a virtual open circuit thus eliminating the fringe capacitances from the circuit, as though the connection between them were broken, such that the total off capacitance at the RF operating frequency remains low when the device is off. In addition, the symmetry of the structure and the closeness of the fingers to one another (5000 Å or less) causes the effect of the airborne capacitance $C_{air}$ to become negligible.

The switch of the present invention has other notable characteristics. For example, associated with gate 66 is a charging RC time constant τ, where:

$$\tau = \frac{\rho_g * \varepsilon_{ox} * L^2}{W_{ox}} \qquad \text{Eq. (4)}$$

In Eq. (4), $\rho_g$ is the sheet resistance of the gate material, $\varepsilon_{ox}$ is the dielectric constant of the oxide layer 64, L is the distance from source to drain and $W_{OX}$ is the thickness of the oxide layer. The time constant τ is closely related to the turn on time of the switch.

Additionally, an input RF signal applied to the drain 53 has a certain period which is inversely proportional to frequency. That is, the lower the frequency, the longer the period. With the switch of the present invention, the sheet resistance $\rho_g$ of the gate is so high, and the distance L between source and drain is so long (compared to conventional MOSFETS) that the gate time constant, given in Eq. (4) is long, for example at least 10 times longer that the longest period of contemplated RF signal to be switched. This ensures that during operation, the gate 66 will not be able to follow the drain RF signal over the range from lowest to highest contemplated frequency to be switched, and therefore the drain signal will not be able to modulate the on resistance. This results in higher device linearity.

As another feature of the high resistance gate, when the device is off, the switched, and possibly high, RF voltage still appears at the drain (or source) adjacent the end of the gate. However, due to the high gate resistance, the gate charge cannot follow the drain RF signal at that corner. Thus, while the gate is clamped, from a DC standpoint, at the DC gate voltage, it floats along, from an AC standpoint, with the RF voltage. In such instance, no large AC voltage differential across the end of the gate is developed thus allowing for a high AC drain voltage before gate-to-drain oxide breakdown, or internal silicon avalanche breakdown can occur. This is quite desirable since the higher the AC breakdown voltage, the higher will be the power rating of the switch.

For the 1 cm periphery device of the present example, the off capacitance may be calculated in accordance with:

$$C_{off} = \frac{\varepsilon_{si} * \frac{W}{2} * P}{L} \qquad \text{Eq. (5)}$$

For a dielectric constant of the silicon, $\varepsilon_{si}$, of $10^{-12}$ Farads/cm, $C_{off}$ is around 0.125 pF, for a width W of 5000 Å.

To a good approximation, the $Z_{on}$ of the finger is given by the relationship:

$$Z_{on} = \rho_{si} * L / P \qquad \text{Eq. (6)}$$

where $\rho_{si}$ is the sheet resistance of the body 54, L is the distance from source to drain as illustrated in FIG. 3 (2 μm in the example), and P is the periphery (1 cm in the example). With a silicon body 54 having a doping concentration of around $9 \times 10^{15}$ cm$^{-3}$, and an on sheet resistance of around 5000 ohms per square, (due to the maximum induced MOS charge layer at the oxide-silicon interface) the $Z_{on}$ of the 71 finger array 51 is approximately 1.1 ohms, including small resistances contributed by the source and drain contact interfaces 59 and 61. $Z_{on}$ is resistive, is designated as $R_{on}$ in Eq. (2).

Substituting these calculated values of off capacitance and on resistance into Eq. (2), the cutoff frequency $F_{cc}$ for the switch 50 is approximately 1.1 THz, allowing for a high operating frequency of over 10 GHZ, while maintaining an off to on impedance ratio $Z_{off}/Z_{on}$ of around 100. Even lower values of W can markedly increase $F_{cc}$. For example, for a W=1000 Å, an $F_{cc}$ approaching 3, to perhaps as high as 5 THz is possible, and is considerably in excess of the cutoff frequencies obtainable with present PHEMT devices.

Switch 50 may be used to control the flow of a high frequency RF signal propagated along a microstrip line. For example FIG. 6 depicts a single pole, single throw (SPST) switch wherein the switch effectively makes and breaks contact in a microstrip line 78. This function may be accomplished by switch 50 of FIG. 6A, as previously described herein, by suitable stripline connections to the drain contact 60 and source contact 58 (not viewable in FIG. 6A). Opening and closing of the switch is governed by application of a gate signal to gate pad contact 72, for example, +5 volts to turn the switch on (close the switch) and −0.5 to −1 volt to turn the switch off (open the switch).

Another particularly useful application of the switch is for selectively directing a microwave signal to one of two outputs, such as illustrated by the single pole, double throw (SPDT) switch 80 of FIG. 7. A microwave signal on input (or output) line 82 can be directed to either a first output line 84 or a second output line 85. Lines 84 or 85 may also serve as input lines. This operation may be constituted by the arrangement of FIG. 7A.

Figure 8:
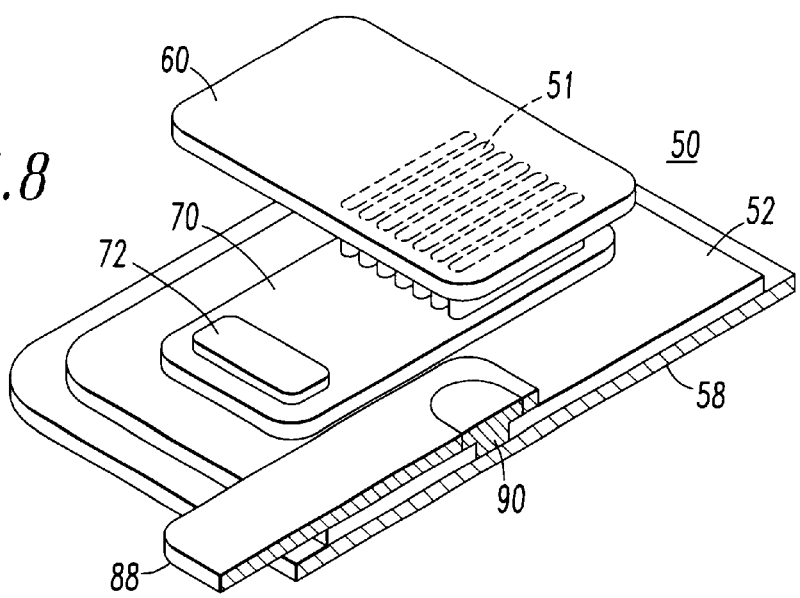
FIG. 8 is a sectional view of the switch illustrated in FIG. 7A.

The SPDT switch 80 of FIG. 7A is comprised of two switches 50 and 50' on a common base having a common input (or output) lead 88. With additional reference to FIG. 8, which is a sectional view through the centerline of the device of FIG. 7A, it is seen that the common base is formed by source contact 58. A via 90 electrically connects the lead 88 with the source contact 58 such that an input RF signal on lead 88 will be directed to output 84 or 85 via a drain contact 60 or 60', depending upon which gate pad 72 or 72' is provided with a positive gate signal. The operation is reciprocal in that an RF signal applied to a drain contact 60 or 60' will be directed to lead 88, depending upon which gate pad 72 or 72' is provided with a positive gate signal.

One advantage of the switch described herein is the fact that it can be utilized with a variety of substrates. The substrate and switches can be separately fabricated under different temperature conditions, if required, and then joined by automatic methods known to those skilled in the art. One example wherein a plurality of SPDT switches 80, as in FIG. 7A, are used on a low loss substrate, is shown in FIG. 9.

Figure 9:
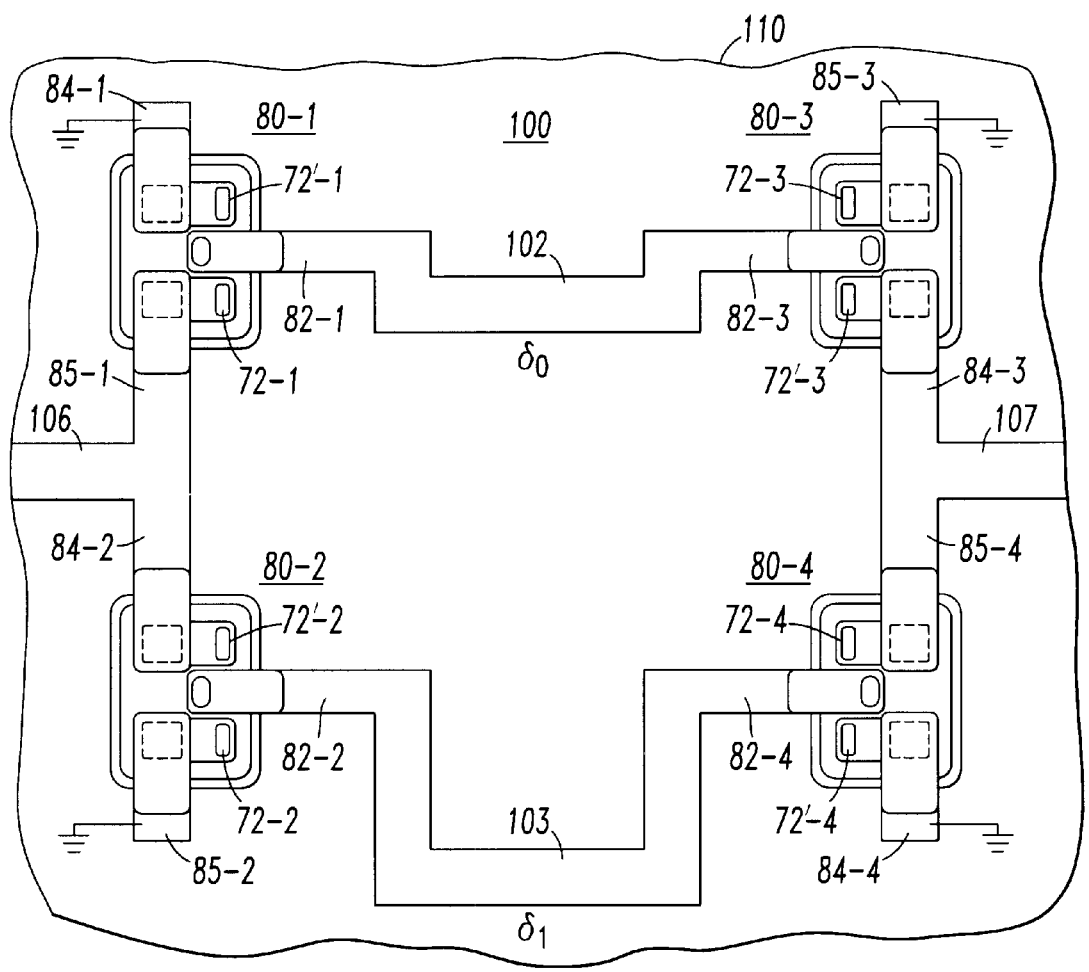
FIG. 9 is a plan view of a time delay circuit utilizing the switches of the present invention.

FIG. 9 illustrates a time delay 100 circuit which includes two paths, one containing a reference delay segment 102, which is operable to provide a delay of $\delta_0$ (which may be zero reference delay) to an RF signal, and the other path containing a delay segment 103, operable to provide a longer delay of $\delta_1$. Time delay circuit 100 is representative of one stage of a multistage true time delay (subsequent stages having progressively longer delays) which may be utilized to provide the necessary phase alteration of radar antenna element signals in order to steer the antenna beam.

The delay segments 102 and 103, as well as input and output lines 106 and 107 are fabricated on a low loss substrate 110, which may be of quartz or sapphire, by way of example. Four SPDT switches 80-1, 80-2, 80-3 and 80-4 (corresponding to switch 80 of FIG. 7A) are inserted after the substrate preparation. The respective switch contacts are brought into electrical connection with the respective delay segments and input and output lines on the substrate 110, by well known thermocompression bonding techniques.

Although the path selection, 102 or 103, for an RF signal on input line 107 may be accomplished with two switches, four such switches are preferred, as in FIG. 9, so that the unused path may be grounded. This grounding of the unused path provides for greater signal isolation and broader bandwidth through elimination of resonances in the unused path.

For example let it be assumed that the desired signal path be via delay segment 103. A gate control signal from a central control (not illustrated) would then be provided to gate contact 72'-2 of switch 80-2, and to gate contact 72-4 of switch 80-4, resulting in a completion of the path from input line 106 to output line 107 via delay segment 103. In addition, gate signals are provided to gate contact 72'-1 of switch 80-1, and to gate contact 72-3 of switch 80-3, to effectively ground delay segment 102 via ground connections to lines 84-1 and 85-3. Similarly, delay segment 102 may be selected for signal flow, while delay segment 103 is grounded, by appropriate application of gate control signals. The entire process may also be reversed with line 107 acting as an input line and line 106 serving as the output line.

Figure 10A:
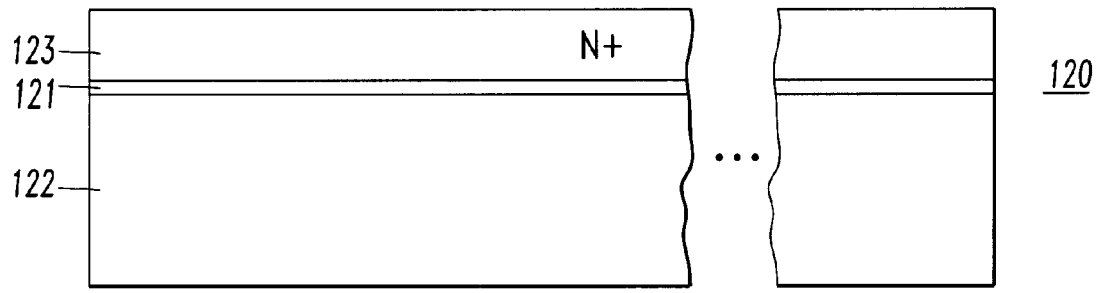
FIGS. 10A to 10K illustrate the steps in fabricating the switch of FIG. 3.

Fabrication steps for producing a switch such as in FIG. 3 are illustrated in FIGS. 10A to 10I. As shown in FIG. 10A, the fabrication process is commenced with an SOI (semiconductor-on-insulator) wafer 120 having an insulating layer in the form of oxide layer 121, sandwiched between base layer 122 and N+ layer 123. Although the semiconductor switch may be fabricated from a variety of semiconductor materials, it will be described by way of example, utilizing silicon.

Figure 10B:
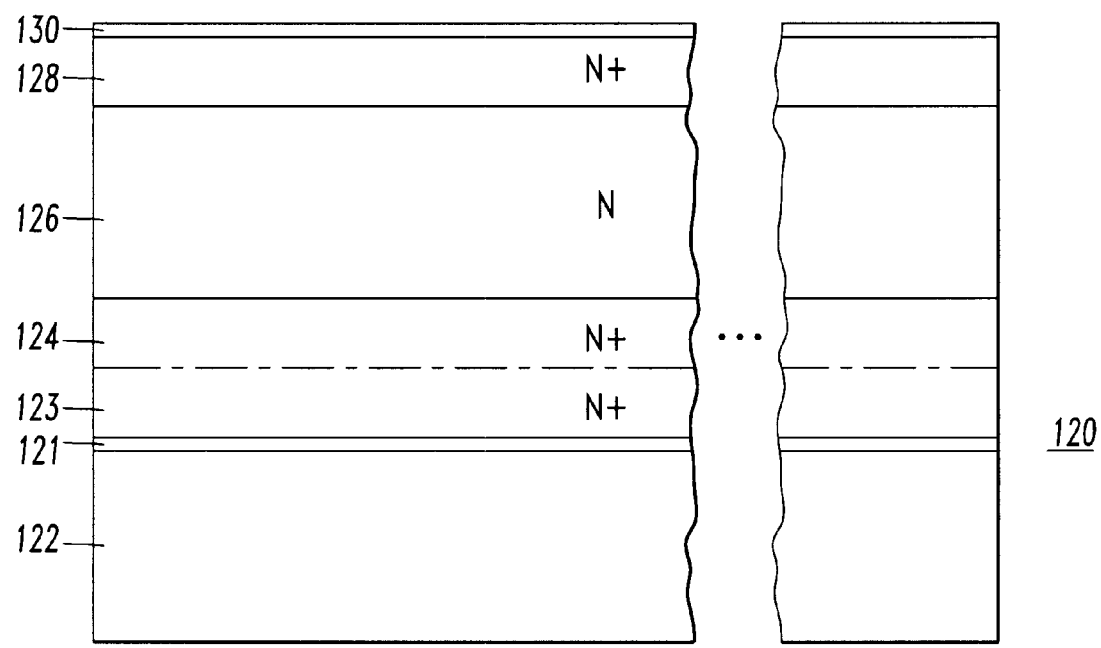

After suitably cleaning the surface of wafer 120, first, second and third epitaxial layers 124, 126 and 128 are grown, forming an N+/N/N+ sandwich, as illustrated in FIG. 10B. The N+ layers 124 and 128 may each have a doping concentration of around $1 \times 10^2$ cm$^{-3}$, while the N layer 126 may have a doping concentration of around $9 \times 10^{15}$ cm$^{-3}$ and a sheet resistance of around 1000 to 5000 ohms per square. A contact interface 130 is deposited on the surface of N+ layer 128, and is comprised of three separate high temperature metallic layers for ohmic contact. These three layers may be constituted by a first layer of titanium, a second layer of tungsten and a third platable layer of platinum.

Figure 10C:
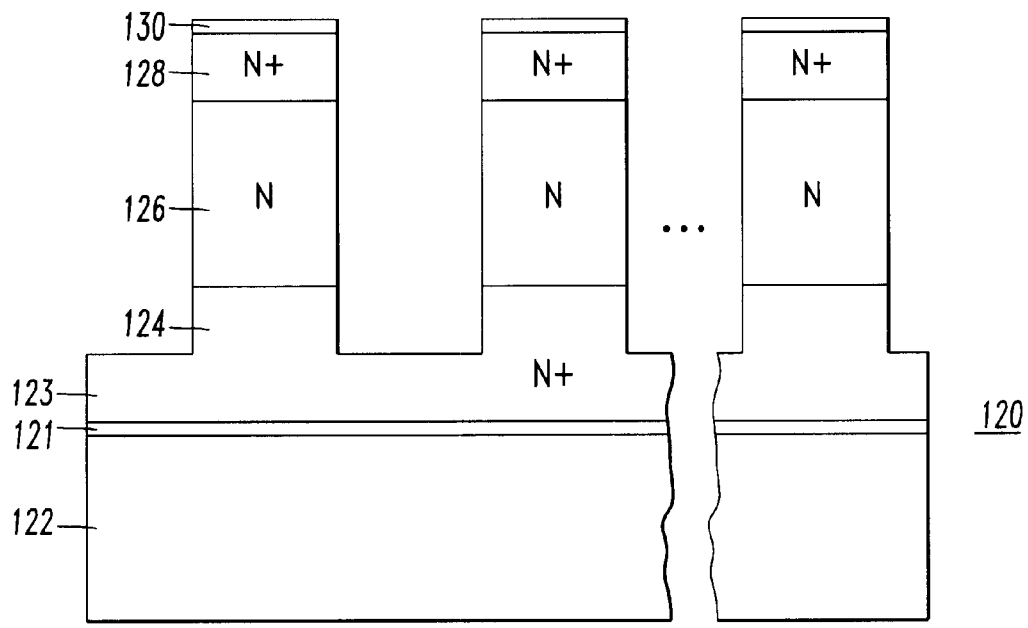

A first mask is applied defining the fingers and is reactive ion etched, as in FIG. 10C. Reactive ion etching is a well-known technique wherein a masking element, or resist, is applied in a pattern to those areas in which it is desired that no material be removed. A reactive ion is then applied to etch away the unmasked portions, thus forming the plurality of parallel fingers illustrated in FIG. 10C, and the masking resist is thereafter removed. Although FIG. 10C illustrates the group of fingers for one switch device, it is to be understood that many such finger groups are simultaneously formed in the N+/N/N+ deposition on wafer 120.

Figure 10D:
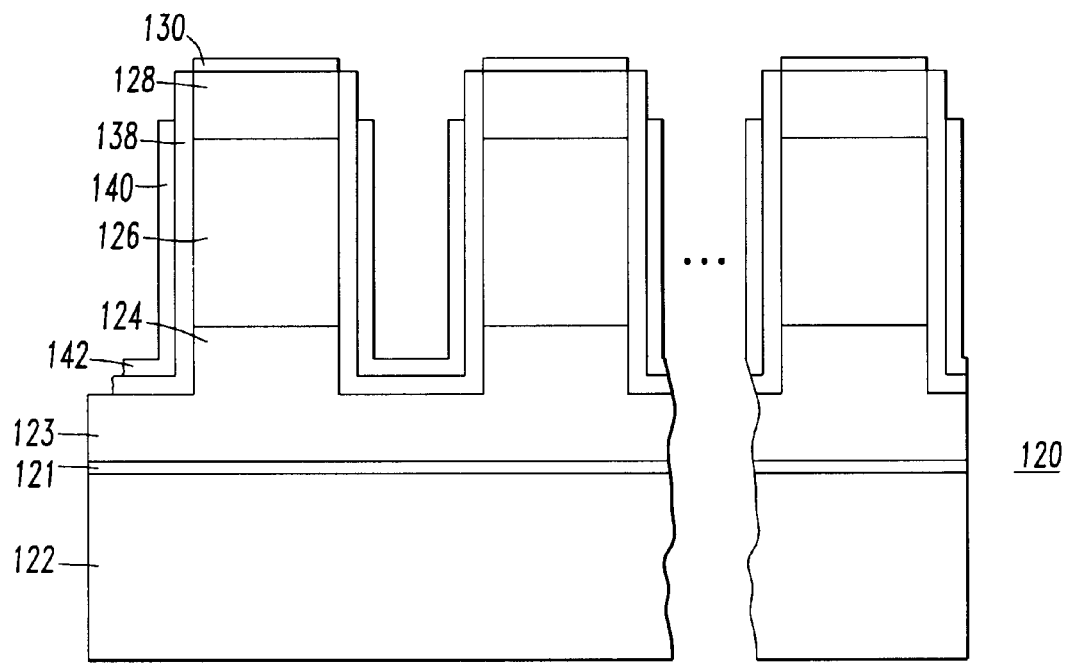

The process continues, as in FIG. 10D, with the application of an oxide layer 138 to the desired thickness, and the subsequent deposition of the high sheet resistance gate layer 140. The application of the oxide layer 138 may be accomplished by a deposition procedure wherein the silicon finger structure is placed in a high temperature oven into which is introduced oxygen gas and a silicon containing gas, such as silane. The result of the process is a deposition of $SiO_2$ as the oxide layer 138.

Alternatively, the oxide layer 138 may be thermally grown by a process wherein the silicon finger structure is placed in a high temperature oven into which is introduced oxygen gas. The oxygen reacts with the silicon to form $SiO_2$. In the former procedure the width W of a finger remains the same as prior to the addition of the oxide layer 138. In the latter procedure the original width of the finger is reduced by approximately the thickness of the oxide layer, resulting in a smaller value of W for the finger.

The vertical fingers are masked, along with the vertical portions of the oxide layer 138 and gate layer 140 to allow for a vertical implantation of a dopant to reduce the sheet resistance of the regions 142 between the fingers, and elsewhere, such reduced sheet resistance layer constituting the gate pad 70, illustrated in FIG. 4. The step of FIG. 10D may also include a sintering of the multilayered metallic interface 130, and an etching of the edge of gate layer 140 to the position illustrated.

Figure 10E:
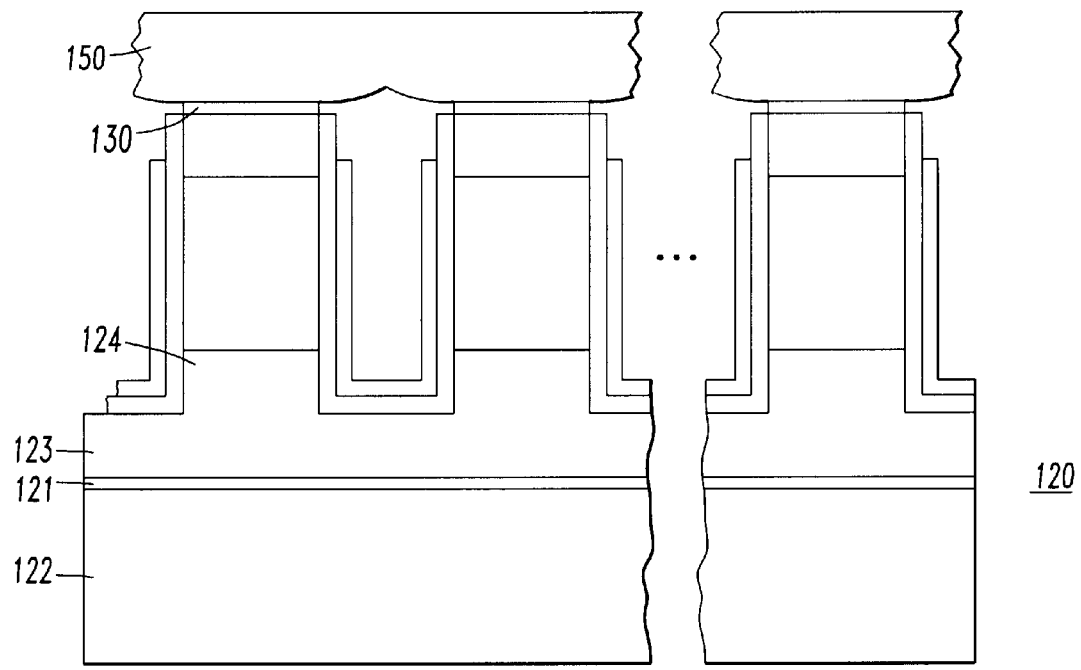

In FIG. 10E the wafer is submerged into a gold plating solution and the platinum surfaces of the interfaces 130 are plated until they merge together to form an ohmic contact 150, corresponding to the drain contact 60 of FIG. 3. At this point the device is cleaned, and if desired, it may be electrically tested.

Figure 10F:
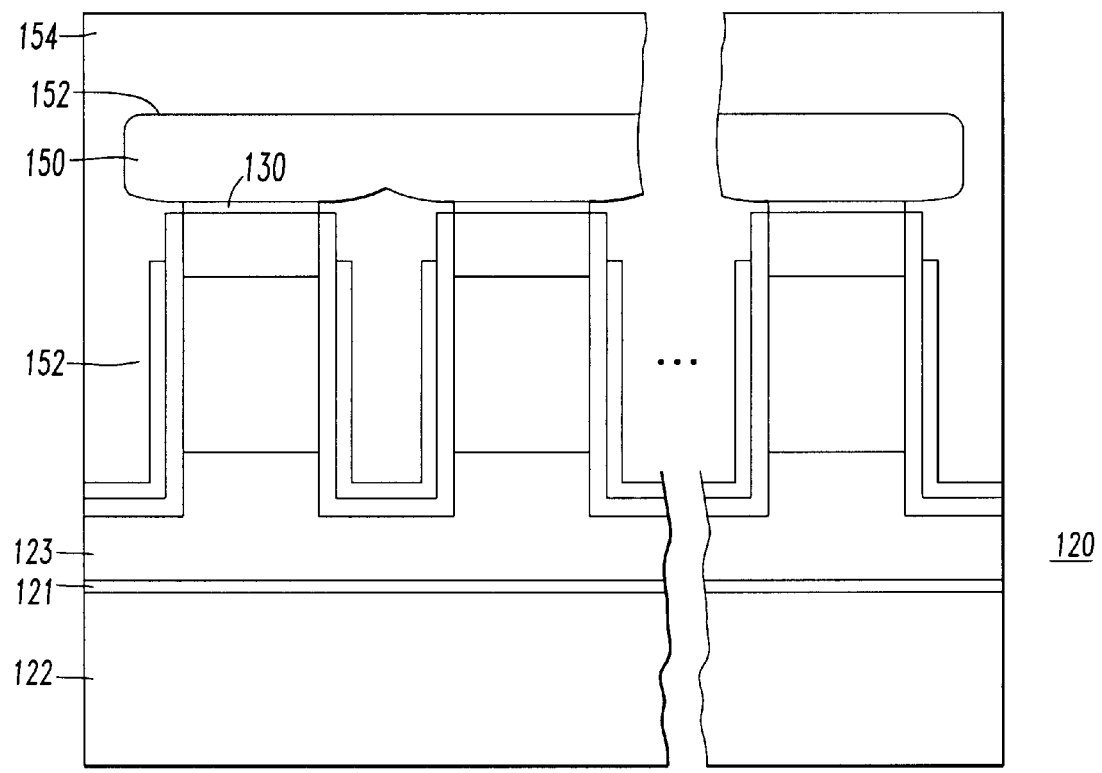

In FIG. 10F a plating seed layer 152 of titanium-gold is applied to the entire device surface permitting the plating of a relatively thick, for example 150 $\mu$m, nickel layer 154 to serve as a grip or handle for manipulating the device for further processing.

Figure 10G:
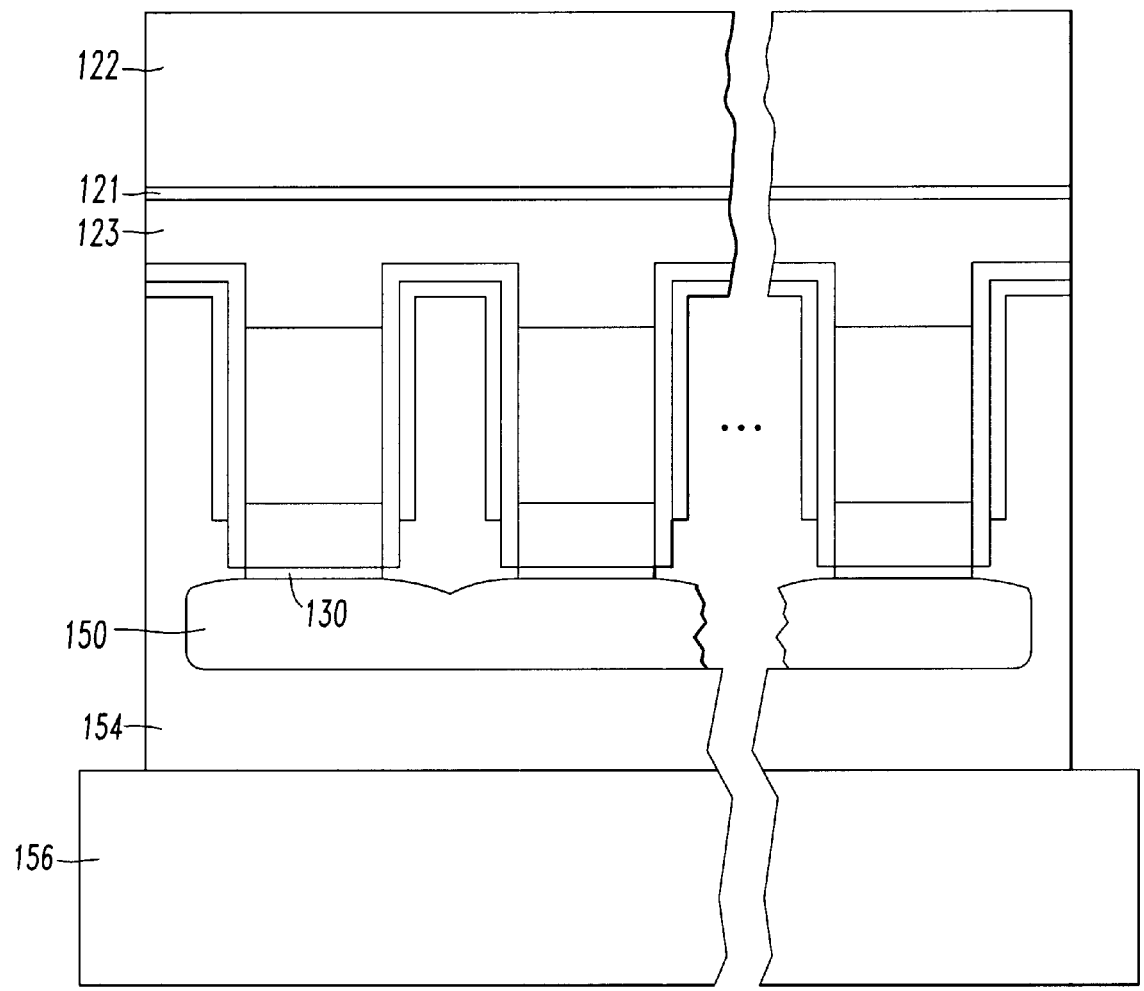

Although the nickel layer 154 permits handling, it still may bend and buckle somewhat. Therefore, after plating, and as illustrated in FIG. 10G, the device is turned over and mounted, nickel face down, on a silicon carrier wafer 156 which is more rigid and strengthens the structure for further processing.

Figure 10H:
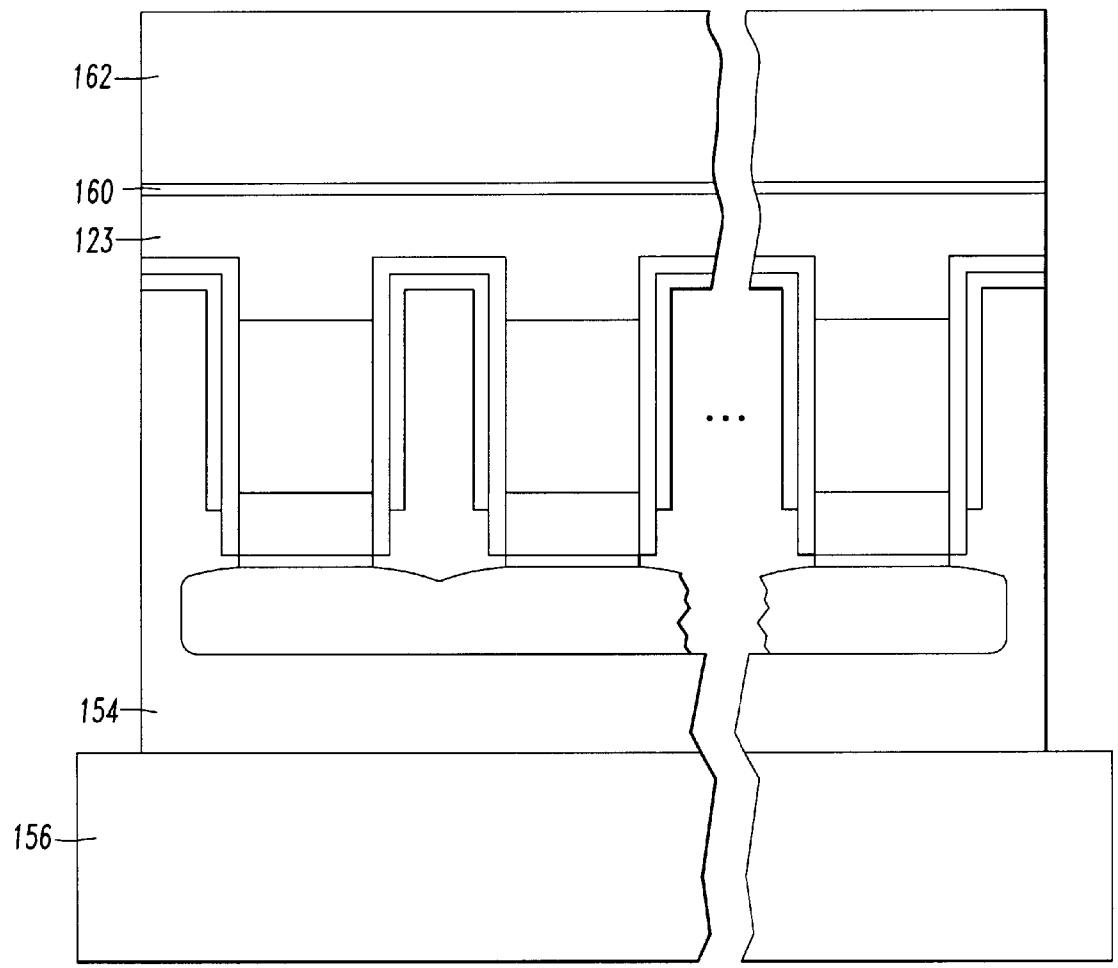

In FIG. 10H an ohmic contact layer 160 has been deposited after removal of the original base layer 122 and oxide layer 121 such as by chem-mechanical polishing and etching. After proper sintering of the interface 160, an ohmic contact 162, such as gold, is deposited. By means of a mask arrangement the gold deposition will form all of the individual source contacts, corresponding to source contact 58 of FIG. 3, for all of the devices being simultaneously fabricated on the wafer.

Figure 10I:
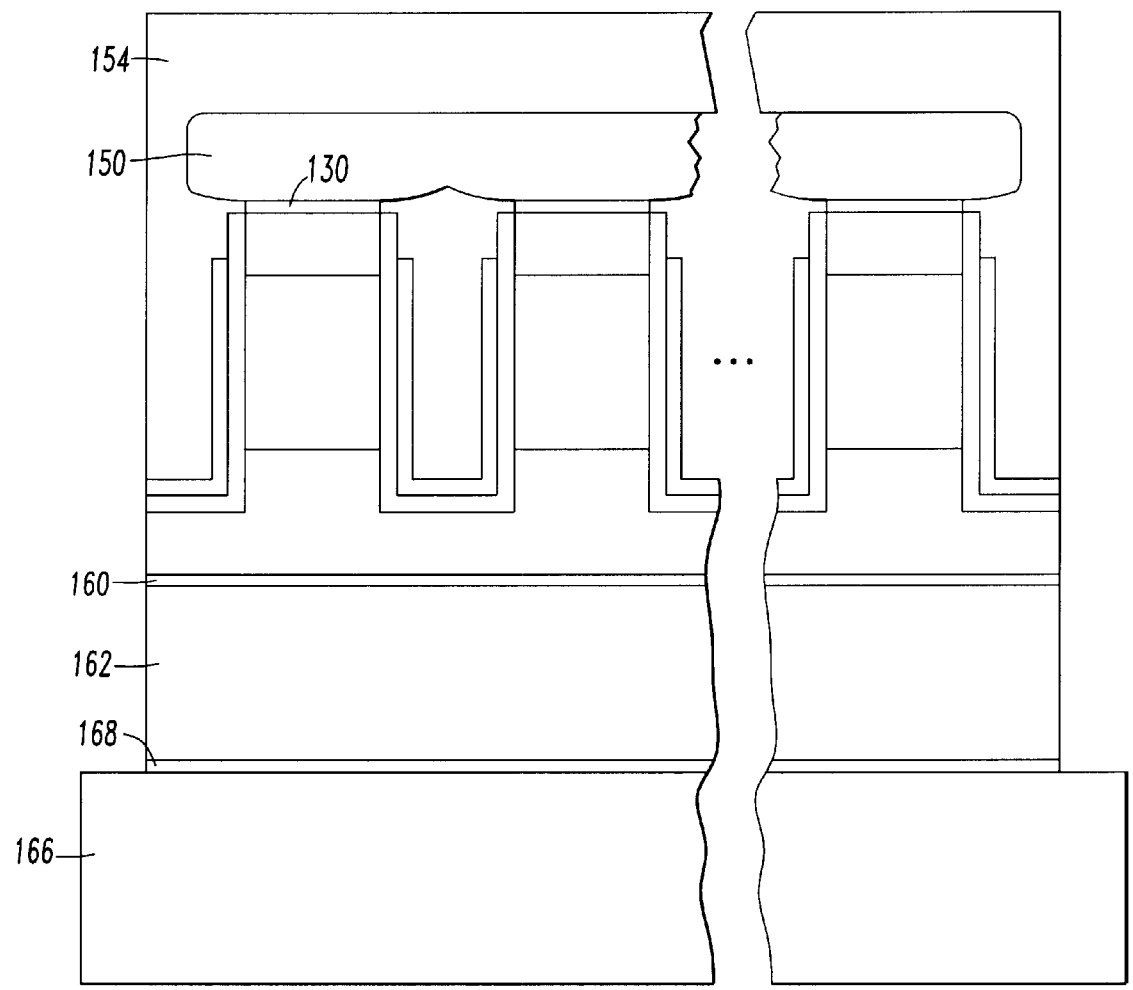

The mask resist is stripped away and the material between the adjacent switch devices being fabricated is etched so that they are "separated" although they are still attached to the nickel handle 154. Carrier wafer 156 is removed and, as illustrated in FIG. 10I, the device is affixed, source side down, to a second carrier wafer 166, such as by apiezon wax 168.

Figure 10J:
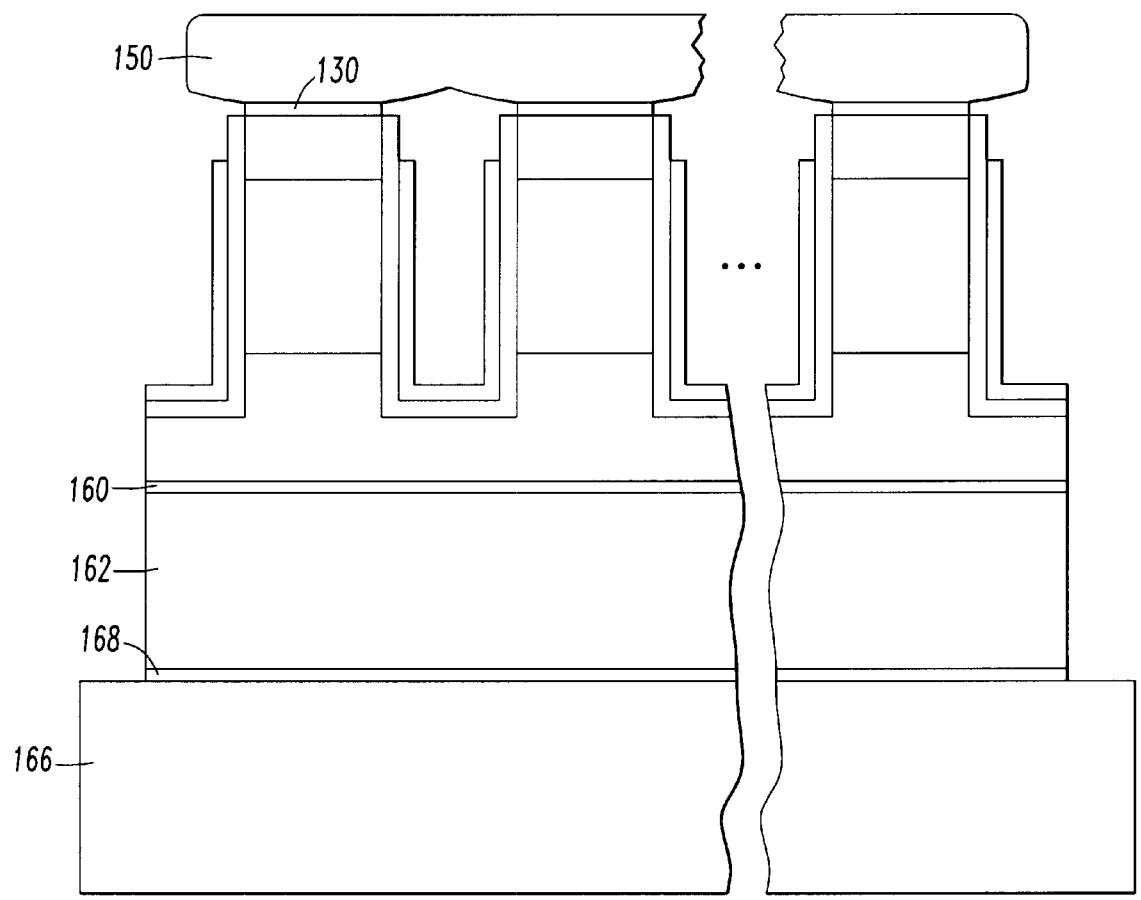

The nickel handle 154 is etched away in a container sufficiently large to accommodate the carrier wafer 166, and the structure is rinsed a number of times in solvents until clean, as depicted in FIG. 10J.

Figure 10K:
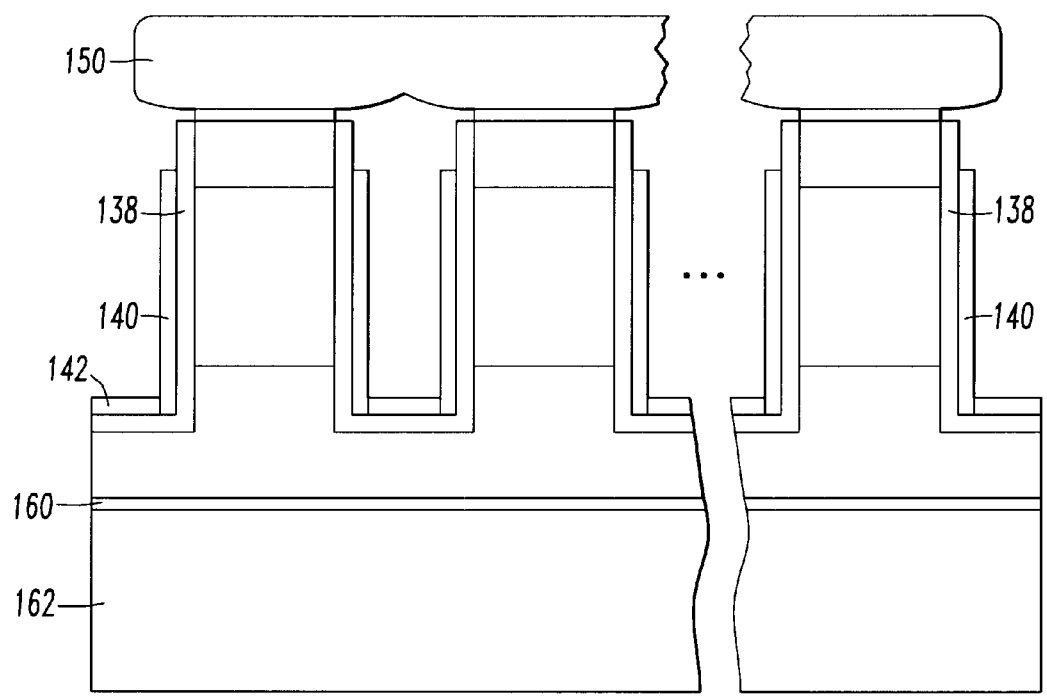

Next, the structure is dipped in a wax solvent such that the individual switches, such as in FIG. 10K, will separate into solution and, after several decantations of clean solvent, will remain at the bottom of the container where they may be collected and dried for testing and subsequent insertion into a microwave circuit.

Figure 11:
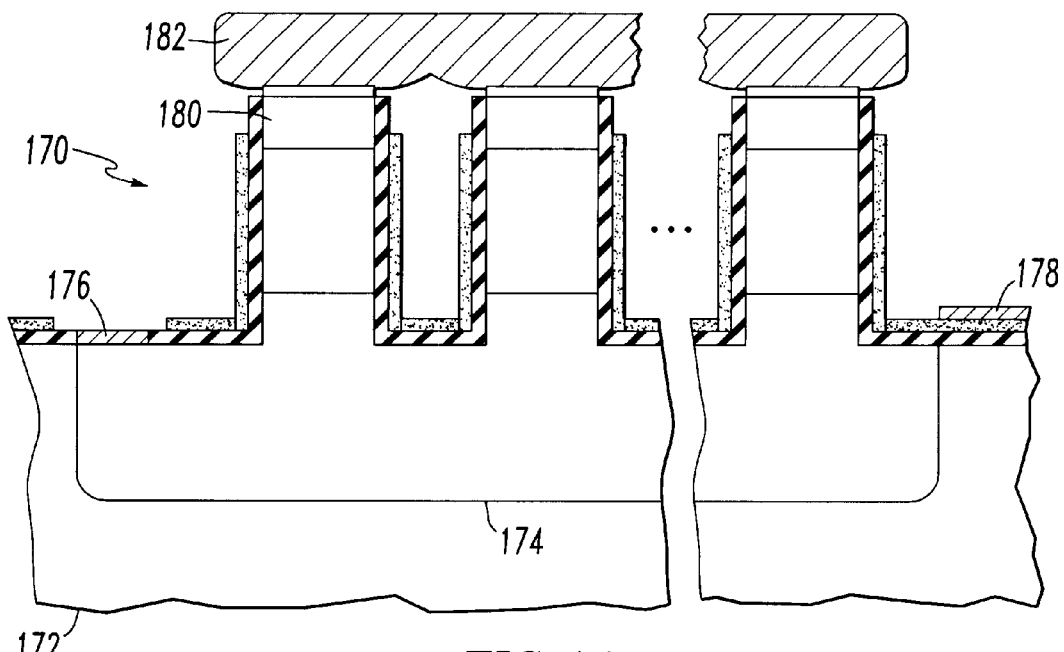
FIG. 11 illustrates an alternate embodiment of the present invention.

In an alternate embodiment, and as illustrated in FIG. 11, a switch device 170, as previously described, may be fabricated as an integral part of an integrated circuit. More particularly, switch device 170 is formed on an integrated circuit wafer 172 of high resistivity silicon. The source region 174 is a heavily doped N+ region to which electrical connection is made by means of source contact 176 on the top surface of integrated circuit wafer 172. The gate control signal is provided via gate contact pad 178, as previously described, and electrical connection is made to drain regions 180 by means of drain contact 182.

It will be readily seen one of ordinary skill in the art that the present invention fulfills all of the objects set forth herein. After reading the foregoing specification, one of ordinary skill in the art will be able to effect various changes, substitutions of equivalents and various other aspects of the present invention as broadly disclosed herein. It is therefore intended that the protection granted hereon be limited only by the definition contained in the appended claims and equivalents. Having thus shown and described what is at present considered to be the preferred embodiment of the present invention, it should be noted that the same has been made by way of illustration and not limitation. Accordingly, all modifications, alterations and changes coming within the spirit and scope of the present invention are herein meant to be included.

What is claimed is:

1. An RF solid state switch, comprising:
   (A) a plurality of adjacent semiconductor fingers each having first and second ends and an intermediate body portion, with one of said ends constituting a source region and the other of said ends constituting a drain region;
   (B) each said finger having a width W, where W is less than around 5000 Å;
   (C) each said finger having an oxide layer on the surface thereof;
   (D) each said finger having a resistive gate layer on said oxide layer;
   (E) said resistive gate layer having a sheet resistance $\rho_g$ in the range of 100,000 to on the order of $5 \times 10^6$ ohms per square; and
   (F) respective electrical contacts in electrical communication with said gate layer, and said source and drain regions.

2. A switch according to claim 1 wherein:
   (A) said sheet resistance $\rho_g$ is at least $5 \times 10^6$ ohms per square.

3. A switch according to claim 1 wherein:
   (A) said first and second ends, and said intermediate body portion are all of the same conductivity type, with said first and second ends having a higher doping concentration than said intermediate body portion.

4. A switch according to claim 1 wherein:
   (A) the length of said intermediate body portion between said source and drain regions is on the order 2 µm.

5. A switch according to claim 1 wherein:
   (A) the pitch of said adjacent semiconductor fingers is on the order of 1 µm.

6. A switch according to claim 1 wherein:
   (A) the thickness of said oxide layer is on the order of 100 Å to 1000 Å.

7. A switch according to claim 1 wherein:
   (A) the thickness of said gate layer is on the order of 100 Å to 1000 Å.

8. A switch according to claim 1 wherein:
   (A) said semiconductor fingers are of silicon; and
   (B) said gate layer is a polysilicon.

9. A switch according to claim 1 wherein:
   (A) said fingers extend for a distance D; and
   (B) said extended fingers are parallel to one another.

10. A switch according to claim 1 wherein:
    (A) said switch is operated in the enhancement mode of operation whereby a positive gate voltage applied to said gate layer will turn said switch on.

11. An RF solid state switch, comprising:
    (A) a plurality of adjacent vertical semiconductor fingers each having first, second and third layers with said first layer constituting one of a source or drain region and said third layer constituting the other of a source or drain region;
    (B) said fingers extending from, and having a common one of said source or drain regions, so as to define fingers having distal ends, as well as horizontal interfinger portions;
    (C) each said finger having a width W, where W is less than around 5000 Å;
    (D) each said finger having an oxide layer on the vertical surfaces thereof and in said horizontal interfinger portions;
    (E) each said finger having a resistive gate layer on said oxide layer so as to extend along said vertical surfaces, as well as along said horizontal interfinger portions;
    (F) said resistive gate layer which extends along said vertical surfaces having a sheet resistance $\mu_g$ in the range of 100,000 to on the order of $5 \times 10^6$ ohms per square;
    (G) said resistive gate layer which extends along said horizontal interfinger portions constitutes a gate pad having a sheet resistance lower than said resistive gate layer which extends along said vertical surfaces; and (H) respective electrical contacts in electrical communication with said gate layer, and said source and drain regions.

12. A switch according to claim 11 wherein:
(A) said first, second and third layers are of the same conductivity type, with said first and third layers having higher doping concentrations than said second layer.

13. A switch according to claim 11 wherein:
(A) said resistive gate layer has a sheet resistance of at least $5\times10^6$ ohms per square; and
(B) said gate pad has a sheet resistance which is around 1000 times lower than that of said gate layer.

14. A switch according to claim 13 which includes:
(A) a gate pad contact, for application of a control signal, in electrical communication with said gate pad;
(B) said gate pad contact being metallic.

15. A switch according to claim 11 wherein:
(A) said distal ends of said fingers are in electrical communication with a common contact.

* * * * *